(12) United States Patent
Lee

(10) Patent No.: US 9,219,098 B2
(45) Date of Patent: Dec. 22, 2015

(54) ELECTRONIC DEVICE HAVING FLASH MEMORY ARRAY FORMED IN AT DIFFERENT LEVEL THAN VARIABLE RESISTANCE MEMORY CELLS

(71) Applicant: SK hynix Inc., Icheon-si (KR)

(72) Inventor: Hyung-Dong Lee, Icheon-si (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/272,188

(22) Filed: May 7, 2014

(65) Prior Publication Data

US 2015/0137066 A1    May 21, 2015

(30) Foreign Application Priority Data

Nov. 20, 2013  (KR) .................. 10-2013-0141374

(51) Int. Cl.
| | |
|---|---|
| H01L 27/24 | (2006.01) |
| H01L 29/788 | (2006.01) |
| H01L 45/00 | (2006.01) |
| H01L 27/06 | (2006.01) |
| H01L 27/115 | (2006.01) |

(52) U.S. Cl.
CPC ........ *H01L 27/2436* (2013.01); *H01L 27/0688* (2013.01); *H01L 27/11529* (2013.01); *H01L 27/2463* (2013.01); *H01L 29/788* (2013.01); *H01L 45/1233* (2013.01)

(58) Field of Classification Search
None
See application file for complete search history.

(56) References Cited

U.S. PATENT DOCUMENTS

| | | | |
|---|---|---|---|
| 8,258,493 B2 | 9/2012 | Mikawa et al. | |
| 2004/0173826 A1* | 9/2004 | Natori | 257/295 |
| 2007/0252185 A1* | 11/2007 | Kang | 257/295 |
| 2010/0191898 A1 | 7/2010 | Kim et al. | |
| 2010/0211725 A1 | 8/2010 | Nagashima et al. | |
| 2011/0297911 A1* | 12/2011 | Shima et al. | 257/4 |
| 2012/0112257 A1* | 5/2012 | Kato | 257/296 |
| 2013/0256778 A1* | 10/2013 | Sim | 257/316 |

* cited by examiner

*Primary Examiner* — Michael Jung

(57) ABSTRACT

An electronic device includes a memory. The memory includes a first cell array including a plurality of flash memory cells, a first peripheral circuit suitable for controlling the first cell array, a second cell array including a plurality of variable resistance memory cells, and a second peripheral circuit suitable for controlling the second cell array. The first cell array, the first peripheral circuit, and the second peripheral circuit are formed at a first level over a surface of a semiconductor substrate, and the second cell array is disposed at a second level over the surface of a semiconductor substrate, the second level being higher than the first level. A portion of the second cell array overlaps in a plan view the second peripheral circuit and/or the first cell array.

19 Claims, 6 Drawing Sheets

ELECTRONIC DEVICE HAVING FLASH MEMORY ARRAY FORMED IN AT DIFFERENT LEVEL THAN VARIABLE RESISTANCE MEMORY CELLS

CROSS-REFERENCE TO RELATED APPLICATIONS

The present application claims priority to Korean Patent Application No. 10-2013-0141374, entitled "ELECTRONIC DEVICE," and filed on Nov. 20, 2013, which is incorporated herein by reference in its entirety.

TECHNICAL FIELD

Embodiments of the present disclosure relate to memory circuits and devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been sought in the art, and research has been conducted for suitable semiconductor devices. Such semiconductor devices include semiconductor devices which can store data using materials and structures that can be switched between different resistance states according to an applied voltage or current, such as resistive random access memory (RRAM), phase change random access memory (PRAM), ferroelectric random access memory (FRAM), magnetic random access memory (MRAM), E-fuses, etcetera.

SUMMARY

Embodiments of the present disclosure include memory circuits and devices and their applications in electronic devices or systems, and various implementations of an electronic device in which a complex memory device having a variable resistance memory and a flash memory integrated over one substrate is provided.

In an embodiment, an electronic device includes a semiconductor memory, the semiconductor memory including a first cell array including a plurality of flash memory cells; a first peripheral circuit suitable for controlling the first cell array; a second cell array including a plurality of variable resistance memory cells; and a second peripheral circuit suitable for controlling the second cell array. The first cell array, the first peripheral circuit and the second peripheral circuit are formed at the same level in a vertical direction to a surface of a semiconductor substrate, and the second cell array is disposed higher than the first cell array, the first peripheral circuit, and the second peripheral circuit in the vertical direction and overlaps with the second peripheral circuit and the first cell array.

Embodiments of the above device may include one or more of the following.

The first cell array is disposed adjacent to the second peripheral circuit between the first peripheral circuit and the second peripheral circuit in a horizontal direction parallel to the surface of the semiconductor substrate. The electronic device further comprises a multi-layer interconnect structure coupling the second cell array and the second peripheral circuit and disposed between the second cell array and the second peripheral circuit.

The first peripheral circuit includes a first peripheral circuit transistor which is formed using the semiconductor substrate, and the second peripheral circuit includes a second peripheral circuit transistor which is formed using the semiconductor substrate, and the first cell array includes a cell transistor and a selection transistor which are formed using the semiconductor substrate. The cell transistor includes a first gate structure wherein a tunnel insulation layer, a floating gate, a charge blocking layer, and a control gate are stacked, and the first peripheral circuit transistor, the second peripheral circuit transistor, and the selection transistor include a second gate structure where at least a portion of the charge blocking layer is removed from the first gate structure so that the floating gate and the control gate of the second gate structure are electrically coupled.

The second cell array includes a plurality of first lines which are extended in a first horizontal direction, a plurality of second lines which are extended in a second horizontal direction to be intersected with the first lines over the first lines, and variable resistance elements which are disposed at cross points of the first lines and the second lines between the first lines and the second lines. The first and second lines are electrically coupled to the second peripheral circuit through multi-layer interconnect structures disposed between the second cell array and the second peripheral circuit in a region where the second cell array and the second peripheral circuit overlap with each other, and at least one of the first lines and second lines are extended to overlap with the first cell array.

The first cell array includes a cell transistor and a selection transistor which are formed using the semiconductor substrate, and the second cell array includes a plurality of first lines which are extended in a first horizontal direction, a plurality of second lines which are extended in a second horizontal direction to be intersected with the first lines over the first lines, and variable resistance elements which are disposed at cross points of the first lines and the second lines between the first lines and the second lines, and a first matrix region where the cell transistor and the selection transistor are arranged overlaps with a portion of a second matrix region where the variable resistance elements are arranged.

The first cell array is electrically coupled to a first external circuit through a conductor disposed in a region external to the first matrix region, and the second cell array is electrically coupled to a second external circuit through a conductor disposed in a region external to the second matrix region.

The first cell array and the first peripheral circuit may function as a first memory for storing user data. The second cell array and the second peripheral circuit may function as a buffer memory for assisting a data input/output of the memory or as a second memory for storing user data.

The second cell array further overlaps the first peripheral circuit.

In an embodiment, an electronic device includes a semiconductor memory. The semiconductor memory includes a semiconductor substrate including a first region and a second region; a second peripheral circuit transistor which is formed using the semiconductor substrate and is disposed in the first region; a cell transistor and a selection transistor of a flash memory which are formed using the semiconductor substrate and are disposed in the second region; and a plurality of first lines which are disposed over the second peripheral circuit transistor and are extended in a first horizontal direction parallel to a surface of the semiconductor substrate, a plurality of second lines which are extended in a second horizontal direction to be intersected with the first lines over the first lines, and variable resistance elements which are disposed at cross points of the first lines and the second lines between the first lines and the second lines, wherein the first and second lines are electrically coupled to the second peripheral circuit transistor through a conductor disposed in the first region, and at least one of the first lines and second lines are extended to the second region.

Embodiments of the above device may include one or more of the following.

The semiconductor substrate further includes a third region, and a first peripheral circuit transistor which is formed using the semiconductor substrate in the third region. The second region is disposed adjacent to the first region between the first region and the third region.

The cell transistor includes a first gate structure wherein a tunnel insulation layer, a floating gate, a charge blocking layer and a control gate are stacked. The second peripheral circuit transistor and the selection transistor include a second gate structure similar to the first gate structure wherein at least a portion of the charge blocking layer is absent so that the floating gate and the control gate of the second gate structure are electrically coupled.

A first matrix region where the cell transistor and the selection transistor are arranged overlaps a portion of a second matrix region where the variable resistance elements are arranged. A gate of the cell transistor and a gate of the selection transistor are electrically coupled to a first external circuit through conductors disposed in an external region of the first matrix region, and the first and second lines are electrically coupled to a second external circuit through conductors disposed in an external region of the second matrix region.

In an embodiment, an electronic device includes a semiconductor memory. The semiconductor memory includes a first cell array including a plurality of first-type memory cells disposed at a first level; a first peripheral circuit configured to control the first cell array and disposed at the first level; a second cell array including a plurality of second-type memory cells disposed at a second level; and a second peripheral circuit configured to control the second cell array and disposed at the first level, wherein the first level is different than the second level in a vertical direction to a substrate, and the second cell array overlaps one or more of the first peripheral circuit, the second peripheral circuit, and the first cell array.

In an embodiment, a method of forming an electronic device comprises forming a first level of circuits using a semiconductor substrate, the first level of circuits including a flash memory cell array, a flash memory peripheral circuit, and a variable resistance memory peripheral circuit; forming a multi-layer interconnect structure over the first level of circuits; and forming a variable resistance memory cell array over the multi-layer interconnect structure, wherein the flash memory cell array is electrically coupled to the flash memory peripheral circuit, and wherein the multi-layer interconnect structure electrically couples the variable resistance memory peripheral circuit to the variable resistance memory cell array.

Embodiments of the above method may include one or more of the following.

Forming the first level of circuits comprises forming first and second tunnel insulation layers; forming first and second floating gates stacked over the first and second tunnel insulation layers, respectively; forming a charge blocking layer stacked over the first floating gate; and forming first and second control gates stacked over the charge blocking layer and the second floating gate, respectively, wherein the second control gate contacts the second floating gate. The charge blocking layer is a first charge blocking layer, and the method further comprises forming a second charge blocking layer between a portion of the second floating gate and a portion of the second control gate.

These and other embodiments are described in greater detail in the drawings, the description and the claims.

DETAILED DESCRIPTION

Figure 1:
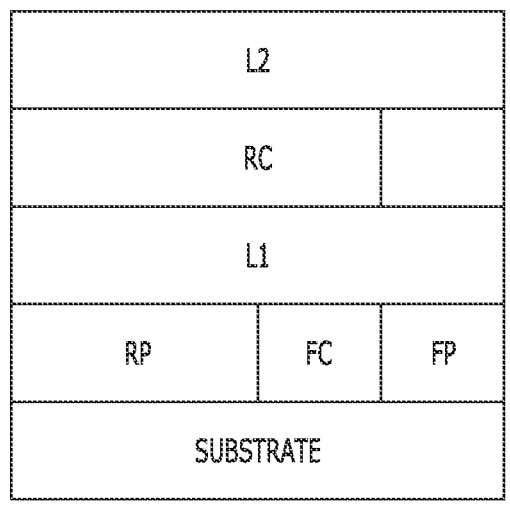
FIG. 1 is a block diagram illustrating a complex memory device in accordance with an embodiment.

Various embodiments of the present disclosure are described below in detail with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or substrate, but may also represent a structure where one or more other intermediate layers exist between the first layer and the second layer or substrate.

A variety of memories currently being developed may be used for different purposes depending on their characteristics. For example, since a dynamic random access memory (DRAM) is a volatile memory and requires a periodic refresh operation although it has a fast operation rate, it may be used for the purpose of storing data for executing software. Since a flash memory is a non-volatile memory and is capable of storing large-capacity data, it may be used for the purpose of storing user data. A variable resistance memory for storing data based on resistance changing characteristics, such as a resistive random access memory (RRAM), a phase-change random access memory (PRAM), a ferroelectric random access memory (FRAM), a magnetic random access memory (MRAM), and so on, may replace the DRAM or the flash memory, or may be used together with the DRAM or the flash memory according to desired characteristics so as to complement them.

Due to differences in the use of the memories as described above, various electronic devices or systems use many types of memories together. For example, a data storing system such as a memory card may include a first type of memory for storing large-capacity data and a second type of memory to perform as a buffer memory for temporarily storing data in order to efficiently input and output data to and from the memories. In an embodiment of the data storing system including both memory for storing data and for buffer memory, flash memory may be used as the memory for storing data, and DRAM may be used as the buffer memory.

When an electronic device or system requires many kinds of memories therein, each of the memories may be formed as a separate individual chip, or formed over different substrates and the substrates join together to be similar in size to memories formed as just one chip. Technology for forming different types of memories over a single substrate does not exist in the related arts since components of each type of memory and methods for fabricating each type of memory are different from each other. These differences can create a variety of problems in terms of process, cost, performance, integration degree, size, and so on.

Embodiments of the present disclosure provide a memory device wherein a variable resistance memory and a flash memory are integrated over one substrate, which is described below in detail with reference to the accompanying FIGS. 1 through 5. A memory device including different types of memories, e.g., a variable resistance memory and a flash memory, will be hereinafter referred to as a 'complex memory device.'

FIG. 1 is a block diagram illustrating a complex memory device in accordance with an embodiment. The complex memory device includes a flash memory comprising a first cell array FC and a first peripheral circuit FP formed over a substrate SUBSTRATE, and a variable resistance memory comprising a second cell array RC and a second peripheral circuit RP formed over the same substrate SUBSTRATE.

Each of the flash memory and the variable resistance memory includes a cell array including a plurality of memory cells and a peripheral circuit including a plurality of circuits for controlling operations of the memory cells. The cell array and the peripheral circuit of the flash memory are referred to as the first cell array FC and the first peripheral circuit FP, respectively. The cell array and the peripheral circuit of the variable resistance memory are referred to as the second cell array RC and the second peripheral circuit RP, respectively.

The first and second peripheral circuits FP and RP include various elements, particularly, transistors formed using a semiconductor substrate, and are disposed on the lowest level in a direction perpendicular to the surface of the semiconductor substrate (hereinafter, referred to as 'a vertical direction').

The memory cells of the flash memory have a structure including transistors formed using the substrate. As a result, the first cell array FC is disposed on the lowest level in the vertical direction, just as the first and second peripheral circuits FP and RP are disposed.

The first and second peripheral circuits FP and RP and the first cell array FC are disposed adjacent to each other in a direction parallel to the surface of the substrate (hereinafter, referred to as 'a horizontal direction'). The first cell array FC is disposed between the first peripheral circuit FP and the second peripheral circuit RP since the second cell array RC is disposed over the first cell array FC as well as over the second peripheral circuit RP, as shown in FIG. 1.

The second cell array RC may be disposed over the first cell array FC, the first peripheral circuit FP and the second peripheral circuit RP in the vertical direction. This is because the memory cells of the variable resistance memory are not formed using the semiconductor substrate SUBSTRATE and have a structure wherein a variable resistance material is interposed between two electrodes. Since two electrodes of a variable resistance memory cell may be controlled by the second peripheral circuit RP, the second cell array RC may be formed over the second peripheral circuit RP to overlap with the second peripheral circuit RP. As shown in FIG. 1, the second cell array RC is also disposed over the first cell array FC to overlap with the first cell array FC. Further, although not shown, the second cell array RC is also disposed over the first peripheral circuit FP to overlap with the first peripheral circuit FP.

Each of the first cell array FC, the first peripheral circuit FP, the second cell array RC, and the second peripheral circuit RP may be electrically coupled to each other and to other circuits through one or more multi-layer interconnect structures according to the design of the complex memory device. The multi-layer interconnect structure includes various conductive patterns formed in the vertical or horizontal direction, such as lines or pads formed in the horizontal direction, contact plugs formed in the vertical direction to couple the first cell array FC, the first peripheral circuit FP, the second cell array RC, and the second peripheral circuit RP to the lines or pads, and so forth.

As shown in FIG. 1, a first layer L1 is disposed between the first cell array FC, first peripheral circuit FP, and second peripheral circuit RP, which are disposed in the lowest layer, and the second cell array RC, which is disposed over the first cell array FC, the first peripheral circuit FP, and the second peripheral circuit RP. The first layer L1 includes a first multi-layer interconnect structure formed therein. The first multi-layer interconnect structure includes various lines, pads, and/or contacts electrically coupled to the first cell array FC, the first peripheral circuit FP and the second peripheral circuit RP. Particularly, the first layer L1 includes lines, pads, and/or contacts for coupling lines of the second cell array RC with components of the second peripheral circuit RP, such as transistors.

As shown in FIG. 1, a second layer L2 is disposed over the second cell array RC and includes a second multi-layer interconnect structure. The second multi-layer interconnect structures includes various lines, pads, and/or contacts electrically coupled to the first cell array FC, the first peripheral circuit FP, the second peripheral circuit RP, and the second cell array RC.

The semiconductor device shown in FIG. 1 is described in detail hereafter with reference to FIGS. 2 to 5.

Figure 2:
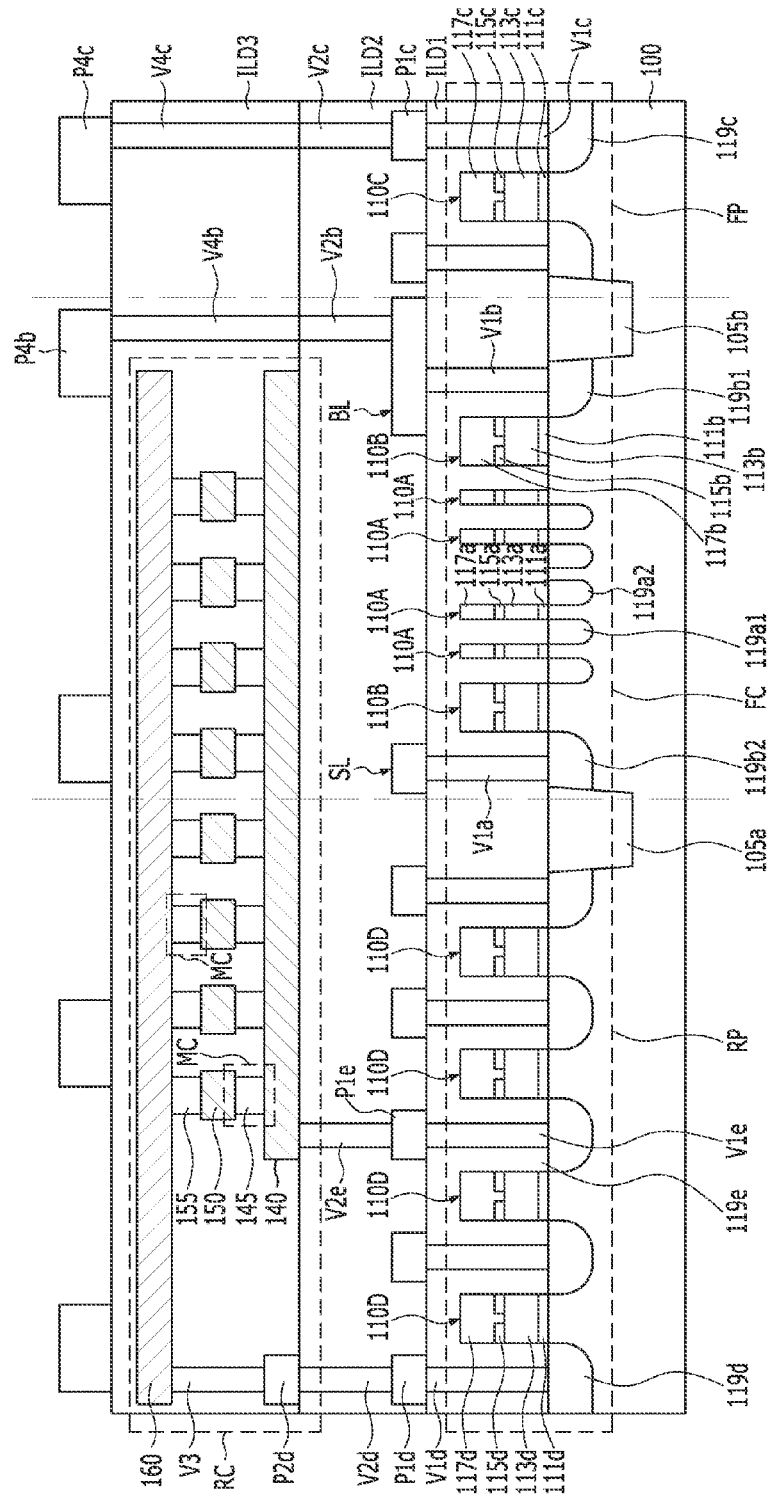
FIG. 2 is a cross-sectional view illustrating the complex memory device shown in FIG. 1.
Figure 3:
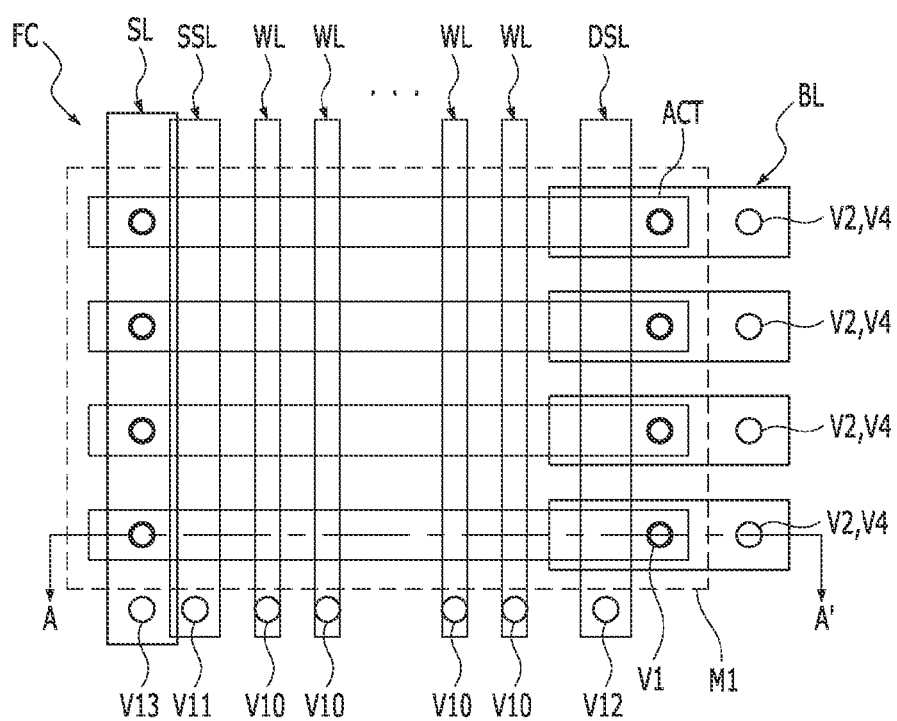
FIG. 3 is a plan view illustrating a first cell array shown in FIG. 2.
Figure 4:
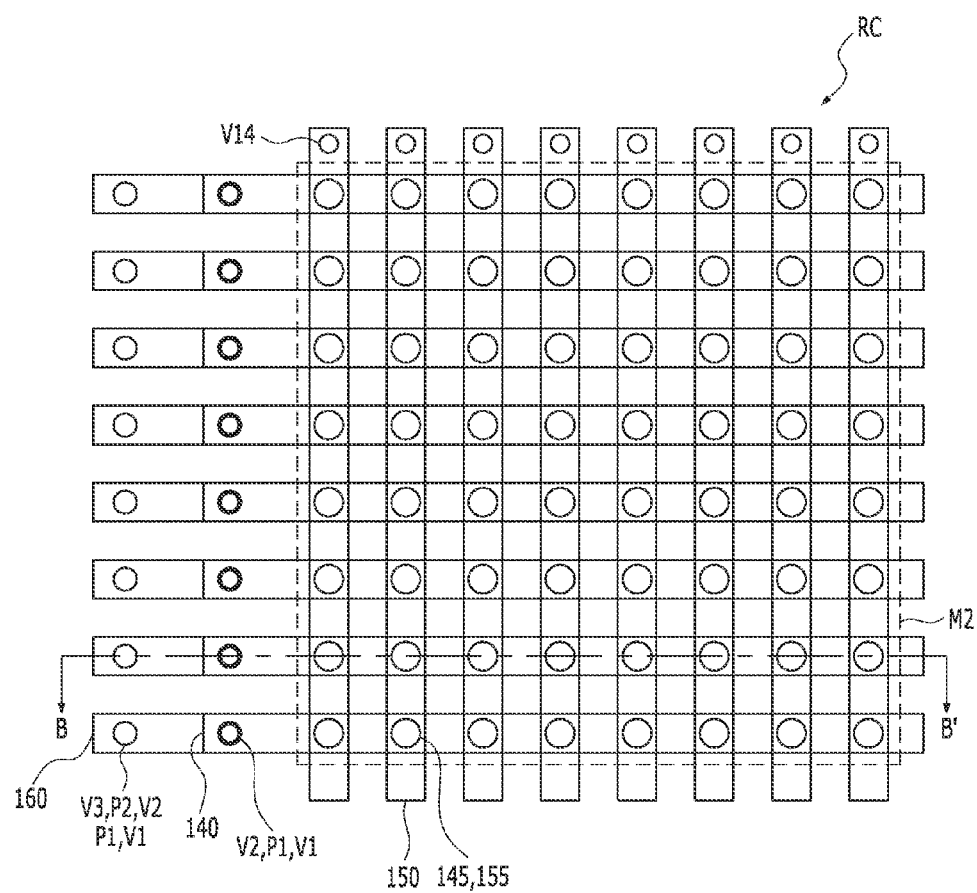
FIG. 4 is a plan view illustrating a second cell array shown in FIG. 2.
Figure 5:
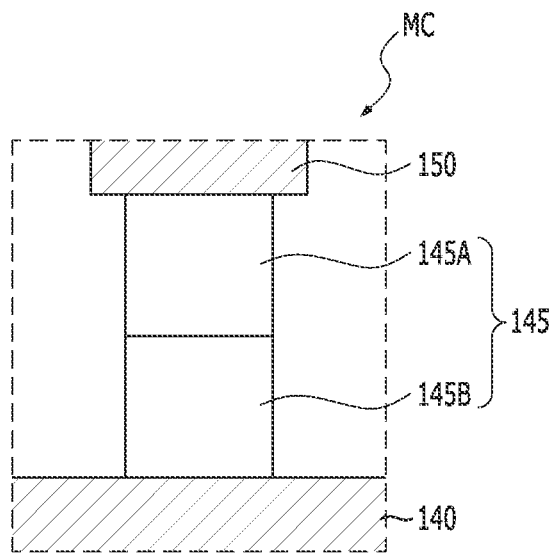
FIG. 5 illustrates a memory cell of the second cell array shown in FIG. 2.

FIG. 2 is a cross-sectional view illustrating a detailed structure of the complex memory device shown in FIG. 1 according to an embodiment. FIG. 3 is a plan view illustrating the first cell array FC shown in FIG. 2. FIG. 4 is a plan view illustrating the second cell array RC shown in FIG. 2. FIG. 5 illustrates in detail a memory cell MC of the second cell array RC shown in FIG. 2. The first cell array FC shown in FIG. 2 is a cross section taken along an A-A' line shown in FIG. 3, and the second cell array RC shown in FIG. 2 is a cross section taken along a B-B' line shown in FIG. 4.

Referring to FIGS. 2 to 5, a semiconductor substrate 100 over which the first cell array FC, the first peripheral circuit FP and the second peripheral circuit RP are formed is provided. The first cell array FC, the first peripheral circuit FP and the second peripheral circuit RP are separated from each other by isolation layers 105a and 105b formed in the semiconductor substrate 100. The semiconductor substrate 100 may be a monocrystalline silicon substrate, and the isolation layers 105a and 105b may be formed of various insulation materials such as an oxide layer, a nitride layer, or a combination of an oxide layer and a nitride layer.

A cell array of a flash memory is disposed in the first cell array FC. In an embodiment shown in FIG. 2, a cell array of a NAND flash memory in which a plurality of cell transistors 110A are coupled in series between two selection transistors 110B is described, but embodiments are not limited thereto. In some embodiments, various types of flash memory cells may be disposed in the first cell array FC.

Each of the cell transistors 110A includes a gate structure including a tunnel insulation layer 111a, a floating gate 113a, a charge blocking layer 115a and a control gate 117a, which are sequentially stacked over an active region ACT of the semiconductor substrate 100 (shown in FIG. 3), and junction regions 119a1 and 119a2 formed in the semiconductor substrate 100 on both sides of the gate structure.

Each of the selection transistors 110B includes a gate structure including a tunnel insulation layer 111b, a floating gate 113b, a charge blocking layer 115b, and a control gate 117b, which are sequentially stacked, similarly to the cell transistor 110A, and a junction region 119b1 or 119b2 formed in the semiconductor substrate 100 on one side of the gate structure, but a portion of the charge blocking layer 115b is removed so that the floating gate 113b and the control gate 117b may be electrically coupled. When a first multiple layer deposition process for forming the gate structure of the cell transistor 110A and a second multiple layer deposition process for forming the gate structure of the selection transistor 110B are carried out together, the structure shown in the drawing may be formed. However, embodiments are not limited thereto, and the whole charge blocking layer 115b may be absent from the selection transistor 110B, that is, forming the charge blocking layer 115b may not be performed, or the charge blocking layer 115b may be entirely removed after being formed.

When the first multiple layer deposition process for forming the gate structure of the cell transistor 110A and the second multiple layer deposition process for forming the gate structure of the selection transistor 110B are carried out separately, the gate structures of the cell transistor 110A and the selection transistor 110B may be different from each other. The gate structure of the selection transistor 110B may have a variety of forms each having a stacked structure of a gate insulating layer and a gate electrode.

The control gates 117a and 117b of the cell transistor 110A and the selection transistor 110B, respectively, extend in a direction perpendicular to a direction in which the active region ACT extends in the semiconductor substrate 100. The control gates 117a and the control gates 117b form word lines WL and selection lines SSL and DSL, respectively, shown in FIG. 3. The selection line disposed on one side of the word lines WL is a source selection line SSL and the selection line disposed on the other side of the word lines WL is a drain selection line DSL.

The floating gates 113a and 113b have a shape of islands in an intersection region, which may be referred to as a cross point, between the control gates 117a and 117b and the active region ACT. On a plane, the cell transistors 110A and the selection transistors 110B are disposed in a matrix arrangement in the direction over which the active region ACT extends and a perpendicular direction. Hereinafter, the region where the cell transistors 110A and the selection transistors 110B are disposed is referred to as a first matrix region M1.

A first circuit, in which various constituent elements are integrated, such as a transistor, may be formed in the first peripheral circuit FP to control the first cell array FC. A second circuit may be formed in the second peripheral circuit RP to control the second cell array RC. For the sake of convenience in description, one transistor 110C of the first circuit is illustrated in the first peripheral circuit FP, and four transistors 110D of the second circuit are illustrated in the second peripheral circuit RP, but embodiments are not limited thereto.

The transistor 110C of the first peripheral circuit FP is referred to as a first peripheral circuit transistor 110C, and each of the transistors 110D of the second peripheral circuit RP is referred to as a second peripheral circuit transistor 110D. The first peripheral circuit transistor 110C and/or the second peripheral circuit transistor 110D are formed to include the same or a similar gate structure to the gate structure of the selection transistor 110B.

In an embodiment, the first and second peripheral circuit transistors 110C and 110D include tunnel insulation layers 111c and 111d, floating gates 113c and 113d, charge blocking layers 115c and 115d, control gates 117c and 117d, and junction regions 119c and 119d, respectively. In the first and second peripheral circuit transistors 110C and 110D, a portion of the charge blocking layer 115c is removed so that the floating gate 113c and the control gate 117c are electrically coupled, and a portion of the charge blocking layer 115d is removed so that the floating gate 113d and the control gate 117d are electrically coupled. However, embodiments are not limited to the above described structure, and the gate structure of each of the first and second peripheral circuit transistors 110C and 110D may have a variety of forms each having a stacked structure of a gate insulating layer and gate electrode.

The cell transistor 110A, the selection transistor 110B, the first peripheral circuit transistor 110C and the second peripheral circuit transistor 110D described above may be disposed in the lowermost layer in contact with the semiconductor substrate 100 in a vertical direction because each of the transistors 110A-D is formed using the semiconductor substrate 100, that is, active portions of each of the transistors 110A-D include material in the semiconductor substrate 100. Although not illustrated, the first and second peripheral circuits FP and RP may include peripheral circuit elements other than the first and second peripheral circuit transistors 110C and 110D.

The cell transistor 110A, the selection transistor 110B, the first peripheral circuit transistor 110C, the second peripheral circuit transistor 110D and the other peripheral circuit elements may be electrically coupled to an upper layer through a multi-layer interconnect structure having various structures, such as horizontal conductor P1c, vertical conductor V2c, and the like. The junction region 119c on one side of the first peripheral circuit transistor 110C may be electrically coupled to a horizontal conductor P4c, e.g., a line, disposed over a third inter-layer dielectric layer ILD3. The junction region 119c may be electrically coupled to the horizontal conductor P4c through a combination of vertical conductors V1c, V2c, and V4c passing through first through third inter-layer dielectric layers ILD1, ILD2, and ILD3, respectively, and the horizontal conductor P1c. The vertical conductors V1c, V2c, and V4c may have a shape of contact plugs, and the horizontal conductor P1c may have a shape of a pad. In other embodiments, such layer structures and coupling relations may be changed in various ways.

In the first cell array FC, the junction region 119b2 of a first selection transistor 110B on one side of the source selection line SSL and the junction region 119b1 of a second selection transistor 110B on another side of the drain selection line DSL are electrically coupled to a source line SL and a bit line BL disposed over the first inter-layer dielectric layer ILD1 through vertical conductors V1a and V1b, respectively, each of the vertical conductors V1a and V1b passing through the first inter-layer dielectric layer ILD1. FIG. 3 shows the source line SL extending in a direction perpendicular to the active region ACT, and the bit line BL extending in a direction perpendicular to the source line SL, but these directions may be changed in various ways.

FIG. 2 shows the source line SL and the bit line BL disposed at the same level in the vertical direction. In another embodiment, the source line SL and the bit line BL may be disposed at different levels. The source line SL and the bit line BL are disposed at a level higher than the cell transistor 110A and the selection transistor 110B and lower than the second cell array RC.

The word lines WL, the source selection line SSL, the drain selection line DSL, the source line SL, and the bit line BL are electrically coupled to a higher-level layer in a region other than the first matrix region M1 in which the cell transistor 110A and the selection transistor 110B are disposed. In an embodiment, ends of the word lines WL, the source selection line SSL, the drain selection line DSL and the source line SL are electrically coupled to the higher-level layer through vertical and/or horizontal conductors V10, V11, V12 and V13 shown in FIG. 3 disposed in a peripheral region of the first matrix region M1. The end of the bit line BL may be electrically coupled to the horizontal conductor P4b through vertical conductors V2b and V4b disposed in a region external to the first matrix region M1.

When the conductors coupling the word lines WL, the source selection line SSL, the drain selection line DSL, the source line SL, and the bit line BL with the higher-level layer are disposed in a region or regions external to the first matrix region M1, a space over the first matrix region M1 may be freely used. Therefore, a portion of the second cell array RC may be disposed over the first matrix region M1 as described hereafter.

The second peripheral circuit RP is electrically coupled to the second cell array RC. This will described hereafter with the description of the second cell array RC.

The cell array of the variable resistance memory may be disposed in the second cell array RC. The cell array may have a cross point structure wherein memory cells are disposed at cross points of intercrossing upper and lower lines.

As shown in FIGS. 2 and 4, the second cell array RC includes a plurality of first lines 140 and a plurality of second lines 150. The plurality of first lines 140 extend in a first direction parallel to the semiconductor substrate 100. The plurality of second lines 150 are disposed over the first lines 140 and extend in a second direction that is parallel to the semiconductor substrate 100 and perpendicular to the first direction. First variable resistance elements 145 are interposed between the first lines 140 and the second lines 150 at the cross points of the first lines 140 and the second lines 150. The first variable resistance element 145 and portions of the first and second lines 140 and 150 which contact the first variable resistance element 145 may function as a memory cell MC.

The first lines 140 and the second lines 150 are lines for supplying a voltage or a current to both ends of the first variable resistance element 145. The first lines 140 and the second lines 150 may include one or more layers comprising one or more of metals such as platinum (Pt), iridium (Ir), ruthenium (Ru), aluminum (Al), copper (Cu), tungsten (W), titanium (Ti), tantalum (Ta), cobalt (Co), nickel (Ni), and so on, and/or one or more of metallic nitrides such as titanium nitride (TiN), titanium carbo-nitride (TiCN), titanium aluminum nitride (TiAlN), titanium oxynitride (TiON), tantalum nitride (TaN), tantalum carbo-nitride (TaCN), tantalum aluminum nitride (TaAlN), tantalum oxynitride (TaON), tungsten nitride (WN), Molybnium Nitride (MoN), and so on. However, embodiments are not limited thereto, and various conductive materials may be used for the first and second lines 140 and 150.

As shown in FIG. 5, the first variable resistance element 145 interposed between the first line 140 and the second line 150 may include a variable resistance layer 145A which has a characteristic of switching between different resistance states according to the supplied voltage or current. The first variable resistance element 145 may also include a selection element layer 145B which is electrically coupled to one end of the variable resistance layer 145A and controls whether a voltage or current is supplied to the variable resistance layer 145A.

The variable resistance layer 145A may be formed of one or more layers including various materials used for RRAM, PRAM, FRAM, and MRAM, such as one or more of a transition metal oxide, a metal oxide such as a perovskite-based material, a phase change material such as a chalcogenide-based material, a high dielectric material, and a ferromagnetic material. When the variable resistance layer 145A includes a metal oxide, the resistance of the variable resistance layer 145A may be changed based on whether filaments capable of carrying current are formed by oxygen vacancies or metal ions inside of the variable resistance layer 145A.

The selection element layer 145B is configured to allow only small amounts of a current to flow if the supplied voltage is below a predetermined threshold voltage and to allow a great deal of current to flow if the supplied voltage is over the threshold voltage. The selection element layer 145B is interposed between the variable resistance layer 145A and the first lines 140 or second lines 150 in order to prevent a leakage current between memory cells MC coupled to the same first or second line 140 or 150. One or more of a diode, a transistor, a varistor, a Metal-Insulator Transition (MIT) element, and a tunneling barrier formed with an insulation material may be used as the selection element layer 145B.

A plurality of memory cells MC arrayed in the first and second horizontal directions may be stacked in a plurality of layers in a vertical direction. For this, lines of the first direction, which overlap with the first lines 140 and extend in the same direction as the first lines 140, and lines of the second direction, which overlap with the second lines 150 and extend in the same direction as the second lines 150, may be alternately stacked in the vertical direction, and variable resistance elements overlapping with the first variable resistance elements 145 are formed between the lines of the first direction and the lines of the second direction. FIGS. 2 and 4 illustrate a case where the second cell array RC includes the memory cells MC stacked in two layers in the vertical direction.

Accordingly, in addition to the above described features, the second cell array RC further includes third lines 160 extending in the first direction over the second lines 150 and second variable resistance elements 155 interposed between the second lines 150 and the third lines 160 at the intersections of the second lines 150 and the third lines 160. Hereafter, a region where the memory cells are arrayed in the first and second directions on a plane, i.e., where the first and second variable resistance elements 145 and 155 are disposed, is referred to as a second matrix region M2.

The first lines 140, the second lines 150 and the third lines 160 may be electrically coupled to corresponding parts of the second peripheral circuit RP, that is, the junction regions, e.g., 119d and 119e, of various second peripheral circuit transistors 110D, in a region other than the second matrix region M2. The first lines 140 may be electrically coupled to the junction region 119e of one of the second peripheral circuit transistors 110D using multi-layer conductors V2e, P1e, and V1e. The third lines 160 may be electrically coupled to the junction region 119d of another one of the second peripheral circuit transistors 110D through multi-layer conductors V3, P2d, V2d, P1d, and V1d. The second lines 150 may be electrically coupled to a junction region (not shown) of another peripheral circuit transistor through a conductor V14 shown in FIG. 4.

When the second cell array RC has a cross point structure, a space below the second matrix region M2 may be freely used since conductors for coupling the lines 140, 150, and 160 of the second matrix region M2 to circuits below them are all disposed in the regions other than the second matrix region M2. Therefore, a portion of the second matrix region M2 may overlap with the first matrix region M1 in a plan view.

The aforementioned complex memory device has the following advantages.

With the complex memory device where the variable resistance memory and the flash memory are integrated, advantages of both variable resistance memory and flash memory may be obtained. In other words, the variable resistance memory has a fast operation rate and random accessibility, while the flash memory has large data capacity and excellent retention characteristics. Therefore, production cost, power consumption, and the size may be reduced with improved operation efficiency by forming the variable resistance memory and the flash memory over a single substrate.

With the aforementioned complex memory device, it is also possible to simplify a fabrication process and reduce process costs because transistors in a cell array of a flash memory, in a peripheral circuit of the flash memory, and in a peripheral circuit of a variable resistance memory are formed together.

Furthermore, when a cell array of the variable resistance memory has a cross point structure, the cell array of the variable resistance memory may be disposed above a portion of the cell array of the flash memory. Therefore, a planar area of the memory device may be reduced, and the number of the memory cells arrayed in the cell array of the variable resistance memory may be increased, which leads to an increased degree of integration of the memory device.

Figure 6:
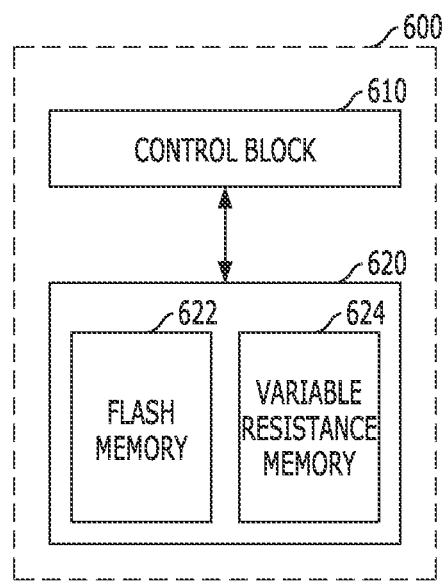
FIG. 6 illustrates a block diagram of an electronic device including a complex memory device in accordance with an embodiment.

The complex memory device in accordance with the embodiments of the present disclosure may be used for various devices or systems. FIG. 6 shows an example of a device or system including the complex memory device in accordance with an embodiment.

Referring to FIG. 6, the electronic device 600 is conceptually any electronic device capable of performing a variety of functions including storing data. For example, the electronic device 600 may be a storage devices such as a Solid State Disk (SSD), a Universal Serial Bus (USB) memory, a Secure Digital (SD) card, a mini Secure Digital (mSD) card, a micro Secure Digital (micro SD) card, a Secure Digital High Capacity (SDHC) card, a Memory Stick card, a Smart Media (SM) card, a Mufti Media Card (MMC), an Embedded MMC (eMMC), a Compact Flash (CF) card and so on, or a variety of electronic devices such as a computer, a server, a Personal Digital Assistant (PDA), a portable computer, a Web tablet, a wireless phone, a mobile phone, a smart phone, a digital music player, a Portable Multimedia Player (PMP), a camera, a Global Positioning System (GPS) receiver, a video camera, a voice recorder, a telematics device, an audio visual system, a smart television, and so on.

The electronic device 600 includes a memory block 620 for storing data and a control block 610 for controlling the memory block 620.

The memory block 620 includes one or more embodiments of the complex memory device including a flash memory 622 and a variable resistance memory 624 as described above. The memory block 620 may include a first cell array including a plurality of flash memory cells, a first peripheral circuit suitable for controlling the first cell array, a second cell array including a plurality of variable resistance memory cells, and a second peripheral circuit suitable for controlling the second cell array. The first cell array, the first peripheral circuit and the second peripheral circuit may be formed in a same first layer over a substrate, and the second cell array is formed in a second layer over the substrate, the second layer being higher than the first layer. The second cell array overlaps one or more of the second peripheral circuit and the first cell array.

Thus, it is possible to form the memory block 620 having multiple functions. In an embodiment, the flash memory 622 may be used for storing high-capacity data, and the variable resistance memory 624 may be used as a buffer memory for temporarily storing data or as an auxiliary memory to effectively perform a data input/output of the memory. In an embodiment, both of the flash memory 622 and the variable resistance memory 624 may be used as the memory for storing the high-capacity data.

Since the multifunctional memory block 620 may be formed together using one substrate, it is possible to increase the degree of integration and reduce power consumption and size while securing the desired operation characteristics of the memory block 620. Consequently, the electronic device 600 may have a reduced size while securing the desired operation characteristics.

A person of ordinary skill in the art in light of the teachings and disclosure herein would understand that the electronic device 600 may include a variety of functional blocks according to its own type, e.g., an interface block, a communication module block, a display block, a central processing block, and so on.

In accordance with the embodiments of the present disclosure, an electronic device includes a complex memory device where a variable resistance memory and a flash memory are integrated over a single substrate.

Figure 7:
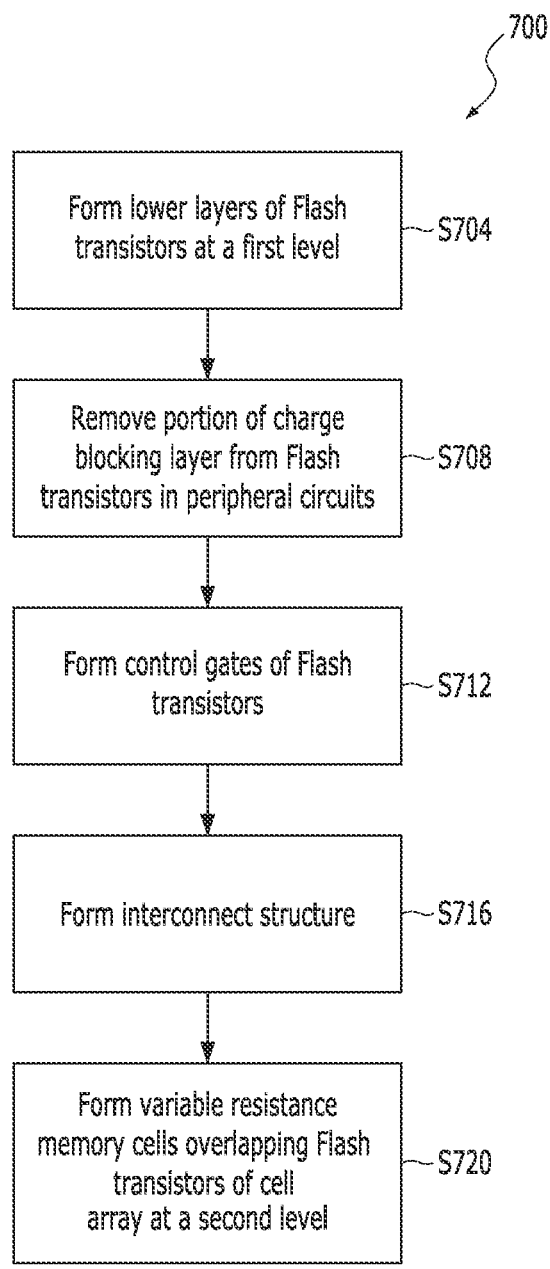
FIG. 7 is a flowchart of a process for forming a complex memory device according to an embodiment.

FIG. 7 shows a process 700 for forming the complex memory device according to an embodiment, and will be described with reference to structures shown in FIG. 2. At S704, the lower layers of the transistors 110A-D are formed at a first level over the substrate 100, the lower layers including the tunnel insulation layers 111a-d, the floating gates 113a-d, and the charge blocking layers 115a-d, respectively.

At S708, portions of the charge blocking layers 115b-d are removed from each of the transistors 110B-D. In an embodiment, the entirety of the charge blocking layer 115b-d is removed from each of the transistors 100B-D. In another embodiment, only the charge blocking layer 115a of the transistors 110A are formed and no removal of charge blocking layers occurs.

At S712, the control gates 117a-d for the transistors 110A-D are formed. In an embodiment, the control gates 117b-d are electrically coupled to the floating gates 113b-d.

At S716, a multi-layer interconnect structure including horizontal and vertical conductors disposed among one or more insulating layers is formed over the transistors 110A-D. One or more of the transistors 110A-D may be coupled to lines and/or memory cells formed at a higher level than the first level through the horizontal and vertical conductors.

At S720, variable resistance memory cells MC are formed at a second level over the substrate, the second level being different than the first level. The second level may be higher than the first level. An area in which the variable resistance memory cells MC are formed overlaps in a plan view with an area where the transistors 110A, 110B, 110D are formed.

Further, although not shown, the area in which the variable resistance memory cells MC are formed overlaps with an area where the transistor 110C is formed. In an embodiment, two or more vertically-stacked layers of variable resistance memory cells are formed.

While the present disclosure includes many specifics, these should not be construed as limitations on the scope of the embodiments or of what may be claimed, but rather as descriptions of features that may be specific to particular embodiments. Certain features that are described in the present disclosure in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination. The separation of various system components in the embodiments described in the present disclosure should not be understood as requiring such separation in all embodiments.

Only a few embodiments are described. Other embodiments, enhancements, and variations can be made based on what is described and illustrated in the present disclosure.

What is claimed is:

1. An electronic device comprising a semiconductor memory unit, the semiconductor memory unit comprising:
    a first cell array including a plurality of flash memory cells disposed at a first level in a vertical direction to a substrate;
    a first peripheral circuit configured to control the first cell array and disposed at the first level;
    a second cell array including a plurality of variable resistance memory cells disposed at a second level which is higher than the first level in the vertical direction; and
    a second peripheral circuit configured to control the second cell array and disposed at the first level,
    wherein the second cell array overlaps the second peripheral circuit and the first cell array.

2. The electronic device according to claim 1, wherein the first cell array is disposed between the first peripheral circuit and the second peripheral circuit.

3. The electronic device according to claim 1, further comprising a multi-layer interconnect structure disposed between the second cell array and the second peripheral circuit and electrically coupling the second cell array to the second peripheral circuit.

4. The electronic device according to claim 1, wherein the first peripheral circuit includes a first peripheral circuit transistor which is formed using the semiconductor substrate, and
    the second peripheral circuit includes a second peripheral circuit transistor which is formed using the semiconductor substrate, and
    the first cell array includes a cell transistor and a selection transistor each formed using the semiconductor substrate.

5. The electronic device according to claim 4, wherein the cell transistor includes a first gate structure comprising a first tunnel insulation layer, a first floating gate disposed over the first tunnel insulation layer, a first charge blocking layer disposed over the first floating gate, and a first control gate disposed over the first charge blocking layer, and
    the first peripheral circuit transistor, the second peripheral circuit transistor and the selection transistor include a second gate structure comprising a second tunnel insulation layer, a second floating gate disposed over the second tunnel insulation layer, a second charge blocking layer disposed over the second floating gate, and a second control gate disposed over the second charge blocking layer, wherein at least a portion of the second charge blocking layer is absent so that the second floating gate and the second control gate are electrically coupled.

6. The electronic device according to claim 1, wherein the second cell array includes:
    a plurality of first lines extending in a first horizontal direction;
    a plurality of second lines disposed over the first lines extending in a second horizontal direction and intersecting the first lines; and
    a plurality of variable resistance elements disposed between the first lines and the second lines at intersections of the first lines and the second lines.

7. The electronic device according to claim 6, wherein the first and second lines are electrically coupled to the second peripheral circuit through a multi-layer interconnect structure disposed between the second cell array and the second peripheral circuit in a region where the second cell array and the second peripheral circuit overlap with each other, and
    at least one of the first lines and second lines extend to overlap with the first cell array.

8. The electronic device according to claim 6, wherein the plurality of variable resistance elements is a first plurality of variable resistance elements, and the second cell array further includes:
    a plurality of third lines disposed over the second lines, extending in the first horizontal direction, and overlapping the plurality of first lines; and
    a second plurality of variable resistance elements disposed between the second lines and third lines at intersections of the second lines and the third lines.

9. The electronic device according to claim 1, wherein the first cell array includes a cell transistor and a selection transistor, and
    the second cell array includes a plurality of first lines which extend in a first horizontal direction, a plurality of second lines disposed over the first lines, extending in a second horizontal direction, and intersecting the first lines, and variable resistance elements which are disposed between the first lines and the second lines at intersections of the first lines and the second lines, and
    a first matrix region wherein the cell transistor and the selection transistor are arranged overlaps with a portion of a second matrix region wherein the variable resistance elements are arranged.

10. The electronic device according to claim 9, wherein the first cell array is electrically coupled to a first other circuit through a conductor disposed in a region external to the first matrix region, and the second cell array is electrically coupled to a second other circuit through a conductor disposed in a region external to the second matrix region.

11. The electronic device according to claim 1, wherein the first cell array and the first peripheral circuit function as a memory for storing user data, and
    the second cell array and the second peripheral circuit function as a buffer memory for assisting a data input/output of the memory.

12. The electronic device according to claim 1, wherein the first cell array and the first peripheral circuit function as a first memory for storing user data, and
    the second cell array and the second peripheral circuit function as a second memory for storing user data.

13. The electronic device according to claim 1, wherein the second cell array further overlaps the first peripheral circuit.

14. An electronic device comprising a semiconductor memory unit, the semiconductor memory unit comprising:
- a semiconductor substrate including a first region and a second region;
- a peripheral circuit transistor disposed in the first region;
- a cell transistor and a selection transistor of a flash memory each disposed in the second region;
- a plurality of first lines disposed over the peripheral circuit transistor and extending in a first horizontal direction parallel to a surface of the semiconductor substrate;
- a plurality of second lines extending in a second horizontal direction and intersecting with the first lines over the first lines; and
- a plurality of variable resistance elements disposed between the first lines and the second lines at cross points of the first lines and the second lines,
- wherein the first and second lines are electrically coupled to the peripheral circuit transistor through a conductor disposed in the first region, and at least one of the first lines and second lines extends to the second region.

15. The electronic device according to claim 14, wherein the peripheral circuit transistor is a second peripheral circuit transistor, and wherein the semiconductor substrate further includes a third region and a first peripheral circuit transistor disposed in the third region.

16. The electronic device according to claim 15, wherein the second region is disposed adjacent to the first region between the first region and the third region.

17. The electronic device according to claim 14, wherein the cell transistor includes a first gate structure wherein a tunnel insulation layer, a floating gate, a charge blocking layer and a control gate are stacked, and
- the peripheral circuit transistor and the selection transistor each include a second gate structure in which the tunnel insulation layer, the floating gate, the charge blocking layer and the control gate are stacked, wherein at least a portion of the charge blocking layer of the second gate structure is absent from the second gate structure so that the floating gate and the control gate of the second gate structure are electrically coupled.

18. The electronic device according to claim 14, wherein a first matrix region where the cell transistor and the selection transistor are disposed overlaps with a portion of a second matrix region where the variable resistance elements are disposed.

19. The electronic device according to claim 18, wherein a gate of the cell transistor and a gate of the selection transistor are electrically coupled to a first other circuit through conductors disposed in a region external to the first matrix region, and the first and second lines are electrically coupled to a second other circuit through conductors disposed in a region external to the second matrix region.

\* \* \* \* \*